United States Patent
Hwang et al.

(10) Patent No.: US 11,526,194 B2
(45) Date of Patent: Dec. 13, 2022

(54) SEMICONDUCTOR CIRCUIT

(71) Applicant: Samsung Electronics Co., Ltd., Suwon-si (KR)

(72) Inventors: Hyun Chui Hwang, Suwon-si (KR); Min Su Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/385,182

(22) Filed: Jul. 26, 2021

(65) Prior Publication Data
US 2022/0149821 A1    May 12, 2022

(30) Foreign Application Priority Data

Nov. 9, 2020    (KR) .......................... 10-2020-0148305

(51) Int. Cl.
*G06F 1/08*       (2006.01)
*H03K 5/156*    (2006.01)
*H03K 3/037*    (2006.01)

(52) U.S. Cl.
CPC .............. *G06F 1/08* (2013.01); *H03K 3/037* (2013.01); *H03K 5/1565* (2013.01)

(58) Field of Classification Search
CPC ........ H03K 5/156; H03K 5/1565; G06F 1/08; G06F 1/10
See application file for complete search history.

(56) References Cited

U.S. PATENT DOCUMENTS

| | | |
|---|---|---|
| 5,357,146 A | 10/1994 | Heimann |
| 6,265,930 B1 | 7/2001 | Walker et al. |
| 6,356,101 B1 | 3/2002 | Erstad |
| 6,507,230 B1 | 1/2003 | Milton |
| 7,456,674 B2 | 11/2008 | Oakland |
| 8,008,961 B2 | 8/2011 | Garg et al. |
| 8,803,554 B2 | 8/2014 | Langadi |
| 9,197,397 B1 | 11/2015 | Ono et al. |
| 2017/0117886 A1* | 4/2017 | Song ................. H03K 5/00006 |

FOREIGN PATENT DOCUMENTS

| | | |
|---|---|---|
| KR | 1998-0050372 A | 9/1998 |
| KR | 1999-0053193 A | 7/1999 |
| KR | 10-0351987 B1 | 9/2002 |

* cited by examiner

*Primary Examiner* — Patrick O Neill
(74) *Attorney, Agent, or Firm* — Harness, Dickey & Pierce, P.L.C.

(57) ABSTRACT

A semiconductor circuit may include a first flip-flop configured to output a first input data as a first output signal in response to an inverted input clock signal, a second flip-flop configured to output a second input data as a second output signal in response to an input clock signal, a glitch-free circuit configured to receive the inverted input clock signal, the input clock signal, the first output signal, and the second output signal, and to determine a voltage level of a node on the basis of the inverted input clock signal, the input clock signal, the first output signal, and the second output signal, and an inverter configured to output an output clock signal obtained by inverting the voltage level of the node determined by the glitch-free circuit. The glitch-free circuit does not include a transistor having a gate connected to the node.

20 Claims, 8 Drawing Sheets

SEMICONDUCTOR CIRCUIT

This application claims priority from Korean Patent Application No. 10-2020-0148305, filed on Nov. 9, 2020 in the Korean Intellectual Property Office, the disclosure of which is incorporated herein by reference in its entirety.

BACKGROUND

Some example embodiments relate to a semiconductor circuit.

Semiconductor integrated circuits such as a SoC (system-on-Chip), a processor, and/or a memory device require/use clock signal. In order to generate the clock signal of a specific frequency, a clock divider that divides the frequency of the input clock signal is generally used.

However, in general, a skew exists in the clock signal generated by the clock divider. For example, the clock signal generated by the clock divider is vulnerable to skew and/or latency. As a result, the clock signal can have poor jitter characteristics. Therefore, a de-skew circuit that removes (or reduces) the skew of the clock signal to improve the jitter characteristics may be used together with the clock divider.

SUMMARY

Some example embodiments provide a semiconductor circuit in which the skew of the input clock signal is removed or reduced to enable a high-speed operation and/or reduce the complexity of a circuit diagram.

According to some example embodiments, a semiconductor circuit may include a first flip-flop configured to output a first input data as a first output signal in response to an inverted input clock signal, a second flip-flop configured to output a second input data as a second output signal in response to an input clock signal, a glitch-free circuit configured to receive the inverted input clock signal, the input clock signal, the first output signal, and the second output signal, and to determine a voltage level of a node on the basis of the inverted input clock signal, the input clock signal, the first output signal, and the second output signal, and an inverter configured to output an output clock signal obtained by inverting the voltage level of the node determined by the glitch-free circuit. The glitch-free circuit does not include a transistor having a gate connected to the node.

According to some example embodiments, a semiconductor circuit may include a first flip-flop configured to output first input data as a first output signal in response to an inverted input clock signal, a second flip-flop configured to output second input data as a second output signal in response to an input clock signal, a first transistor and a second transistor configured to provide a power supply voltage to a node and are connected in series with each other, a third transistor and a fourth transistor connected in parallel with the first transistor and the second transistor and configured to provide the power supply voltage to the node, and connected in series with each other, a fifth transistor and a sixth transistor configured to provide a ground voltage to the node, and connected in series with each other, a seventh transistor and an eighth transistor connected in parallel with the fifth transistor and the sixth transistor and configured to provide the ground voltage to the node, and are connected in series with each other, and an inverter connected to the node and configured to output an output clock signal obtained by inverting a voltage level of the node. The first transistor and the sixth transistor are gated to a voltage level of the inverted input clock signal, a second transistor and the seventh transistor are gated to a voltage level of the first input data, the third transistor and the eighth transistor are gated to a voltage level of the input clock signal, and the fourth transistor and the fifth transistor are gated to a voltage level of the second input data.

According to some example embodiments, a semiconductor circuit may include a first flip-flop configured to output first input data as a first output signal in response to an inverted input clock signal, a second flip-flop configured to output second input data as a second output signal in response to an input clock signal, a glitch-free circuit configured to determine a voltage level of a node on the basis of a voltage level of the second output signal in response to a voltage level of the inverted input clock signal being a first logical level, and to determine the voltage level of the node on the basis of a voltage level of the first output signal in response to the voltage level of the inverted input clock signal being a second logical level, and an inverter configured to output an output clock signal obtained by inverting a determined voltage level of the node.

However, aspects of inventive concepts are not restricted to the one set forth herein. The above and other aspects of inventive concepts will become more apparent to one of ordinary skill in the art to which inventive concepts pertains by referencing the detailed description of inventive concepts given below.

BRIEF DESCRIPTION OF THE DRAWINGS

The above and other aspects and features of inventive concepts will become more apparent by describing in detail exemplary embodiments thereof referring to the attached drawings, in which.

DETAILED DESCRIPTION OF SOME EXAMPLE EMBODIMENTS

Figure 1:
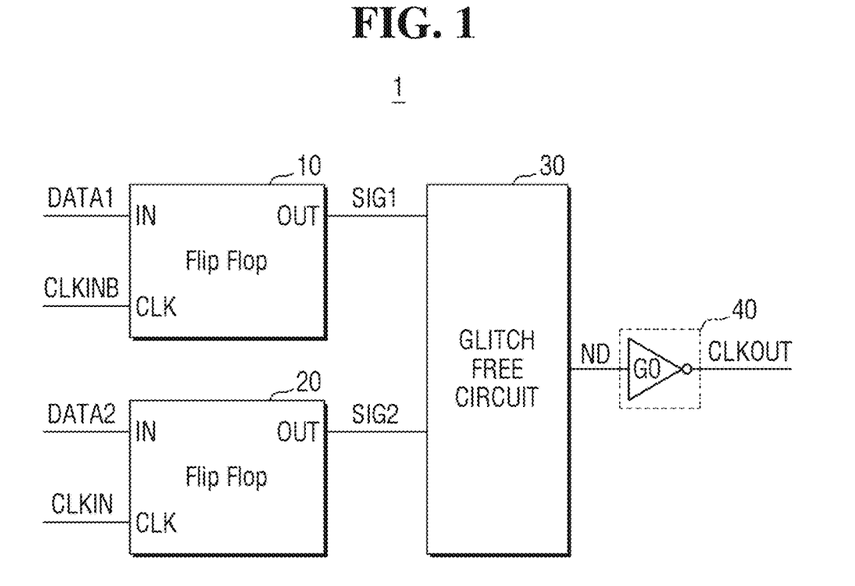
FIG. 1 is a block diagram showing a semiconductor circuit according to some example embodiments.
Figure 2:
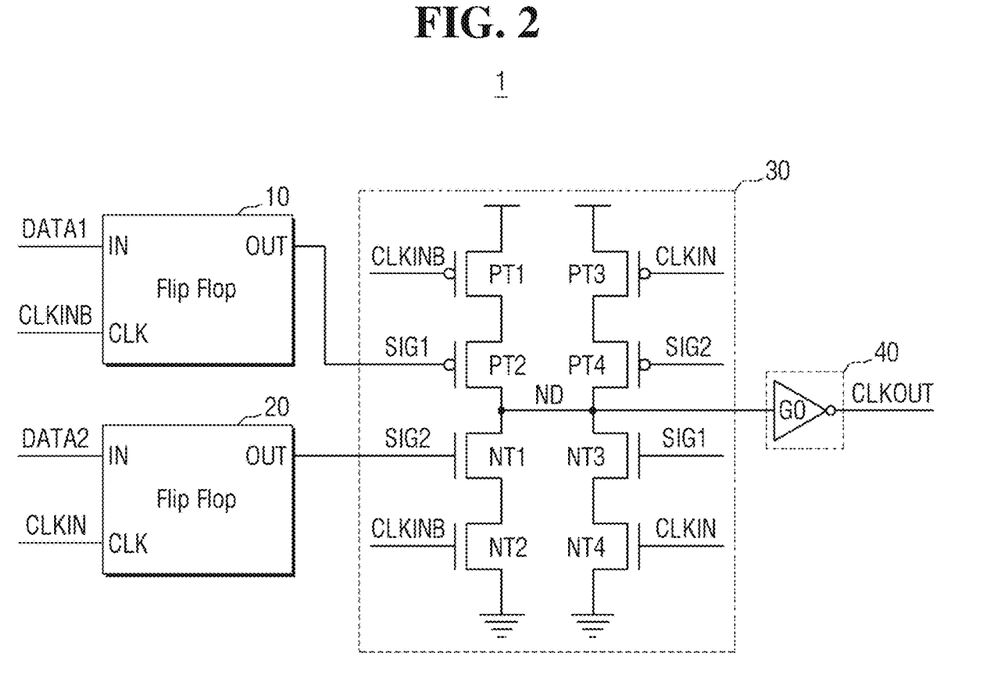
FIG. 2 is a circuit diagram of FIG. 1.
Figure 3:
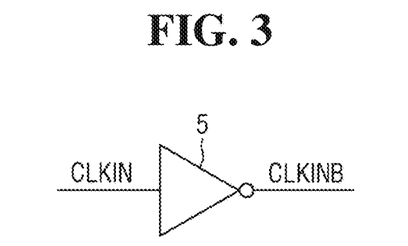
FIG. 3 is a circuit diagram of FIG. 1.

FIG. 1 is a block diagram showing a semiconductor circuit according to some example embodiments. FIGS. 2 and 3 are circuit diagrams of FIG. 1.

Referring to FIGS. 1 to 3, a semiconductor circuit 1 may include a first flip-flop 10, a second flip-flop 20, a glitch-free circuit 30, and an output circuit 40.

The first flip-flop 10 may latch first input data DATA1 and output a first output signal SIG1 in response to an inverted input clock signal CLKINB. Each of first input data DATA1, first output signal SIG1, and inverted input clock signal CLKINB may be voltage signals. The first input data DATA1 may be input to an input terminal of the first flip-flop 10, the inverted input clock signal CLKINB may be input to a clock terminal, and a first output signal SIG1 may be output to an output terminal. The first flip-flop 10 may be, for example, a D flip-flop, a D-Q flip-flop or an S-R flip flop; however, example embodiments are not limited thereto. The first flip-flop 10 may be triggered at a rising edge (positive edge) of the inverted input clock signal CLKINB.

The second flip-flop 20 may latch a second input data DATA2 and output a second output signal SIG2 in response to the input clock signal CLKIN. Each of second input data DATA2, second output signal SIG2, and input clock signal CLKIN may be voltage signals. The second input data DATA2 may be input to an input terminal of the second flip-flop 20, an input clock signal CLKIN may be input to a clock terminal, and a second output signal SIG2 may be output to an output terminal. The second flip-flop 20 may be, for example, a D flip-flop, a D-Q flip-flop, or an S-R flip flop, and may be the same type or a different type from that of the first flip-flop 10; however, example embodiments are note limited thereto. The second flip-flop 20 may be triggered at the rising edge of the input clock signal CLKIN.

The first input data DATA1 and the second input data DATA2 may be the same data or may be different data from each other. The first input data DATA1 and the second input data DATA2 may be, for example, data that are output from the clock divider. For example, the first input data DATA1 and the second input data DATA2 may be data obtained by dividing the input clock signal CLKIN.

Referring to FIG. 3, the inverter 5 may invert the input clock signal CLKIN to output the inverted input clock signal CLKINB.

The glitch-free circuit 30 may include only a transistor which is gated to a voltage level of the inverted input clock signal CLKINB, a voltage level of the input clock signal CLKIN, a voltage level of the first output signal SIG1, and a voltage level of the second output signal SIG2. For example, the glitch-free circuit 30 may not include a transistor gated to the voltage level of the node ND. For example, the glitch-free circuit 30 may include only four transistors. For example, the glitch-free circuit 30 may be controlled only by the inverted input clock signal CLKINB, the input clock signal CLKIN, the first output signal SIG1, and the second output signal SIG2. For example, the glitch-free circuit 30 may not have any transistor with a gate connected to or directly connected to the node ND. For example, there may be a plurality of transistors included in the glitch-free circuit 30; however, none of the transistors included in the glitch-free circuit 30 may have a gate connected to the node ND. The glitch-free circuit 30 may output a voltage level of the node ND.

As a result, the glitch-free circuit 30 may determine the voltage level of the node ND, on the basis of the inverted input clock signal CLKINB, the input clock signal CLKIN, the first output signal SIG1, and the second output signal SIG2.

In the semiconductor circuit according to some example embodiments, the glitch-free circuit 30 may include first to eighth transistors PT1, PT2, PT3, PT4, NT1, NT2, NT3, and NT4. Each of the first to fourth transistors PT1 to PT4 may be PMOS transistors, and each of the four transistors NT1 to NT4 may be NMOS transistors; however, example embodiments are not limited thereto.

A first transistor PT1 may be gated to (e.g. may have a gate connected to/may be turned on or enabled by) the voltage level of the inverted input clock signal CLKINB to provide the power supply voltage to the second transistor PT2. A second transistor PT2 may be connected in series with the first transistor PT1, and gated to (e.g. have a gate connected to/may be turned on or enabled by) the voltage level of the first output signal SIG1 to provide the power supply voltage to the node ND.

A third transistor PT3 may be gated to (e.g. may have a gate connected to/may be turned on or enabled by) the voltage level of the input clock signal CLKIN to provide the power supply voltage to the fourth transistor PT4. A fourth transistor PT4 may be connected in series with the third transistor PT3 and gated to (e.g. have a gate connected to/may be turned on or enabled by) the voltage level of the second output signal SIG2 to provide the power supply voltage to the node ND. The third and fourth transistors PT3 and PT4 may be connected in parallel with the first and second transistors PT1 and PT2.

A sixth transistor NT2 may be gated to (e.g. may have a gate connected to) the voltage level of the inverted input clock signal CLKINB to provide a ground voltage to the fifth transistor NT1. The fifth transistor NT1 may be connected in series with the sixth transistor NT2 and gated to (e.g. have a gate connected to) the voltage level of the second output signal SIG2 to provide the ground voltage to the node ND.

An eighth transistor NT4 may be gated to (e.g. may have a gate connected to) the voltage level of the input clock signal CLKIN to provide the ground voltage to a seventh transistor NT3. The seventh transistor NT3 may be connected in series with the eighth transistor NT4 and gated to (e.g. have a gate connected to) the voltage level of the first output signal SIG1 to provide the ground voltage to the node ND. The seventh and eighth transistors NT3 and NT4 may be connected in parallel with the fifth and sixth transistors NT1 and NT2. When a transistor is gated to a voltage level, the transistor may be turned on or enabled when the voltage level is of a sufficient magnitude, e.g. is greater than a threshold voltage of the transistor. When a transistor is not gated to a node, the transistor may not be turned on or enabled based on a voltage level of the node.

In some example embodiments, the first to fourth transistors PT1, PT2, PT3, and PT4 and the fifth to eighth transistors NT1, NT2, NT3, and NT4 may be different types of transistors. For example, the first to fourth transistors PT1, PT2, PT3, and PT4 may be P type transistors (e.g. PMOS transistors), and the fifth to eighth transistors NT1, NT2, NT3, and NT4 may be N type transistors (e.g. NMOS transistors). Further, physical properties and/or electrical properties such as threshold voltages and/or gate lengths and/or gate widths of each of the first to fourth transistors PT1 to PT4 may be the same, or may be different from, each other; additionally or alternatively, physical properties and/or electrical properties such as threshold voltages and/or gate lengths and/or gate widths of each of the fifth through eight transistors NT1 to NT4 may be the same, or may be different from, each other.

As a result, when the voltage level of the inverted input clock signal CLKINB is a second logical level, for example, when the voltage level of the input clock signal CLKIN is a first logical level, the glitch-free circuit 30 may determine the voltage level of the node ND depending on the voltage level of the first output signal SIG1 (e.g. not depending on the voltage level of the second output signal SIG2). When the voltage level of the first output signal SIG1 is the first logical level, the seventh transistor NT3 and the eighth transistor NT4 may provide the ground voltage to the node ND, and the voltage level of the node ND may be the second logical level. When the voltage level of the first output signal SIG1 is the second logical level, the first transistor PT1 and the second transistor PT2 may provide the power supply voltage to the node ND, and the voltage level of the node ND may be the first logical level.

When the voltage level of the inverted input clock signal CLKINB is the first logical level, for example, when the voltage level of the input clock signal CLKIN is the second logical level, the glitch-free circuit 30 may determine the voltage level of the node ND depending on the voltage level of the second output signal SIG2 (e.g. not depending on the voltage level of the first output signal SIG1). When the voltage level of the second output signal SIG2 is the first logical level, the fifth transistor NT1 and the sixth transistor NT2 may provide the ground voltage to the node ND, and the voltage level of the node ND may be the second logical level. When the voltage level of the second output signal SIG2 is the second logical level, the third transistor PT3 and the fourth transistor PT4 may provide the power supply voltage to the node ND, and the voltage level of the node ND may be the first logical level.

Here, the first logical level may be logical high (e.g. greater than a threshold voltage of an NMOS transistor), and the second logical level may be logical low (e.g. less than a threshold voltage of an NMOS transistor).

For example, when the voltage level of the inverted input clock signal CLKINB is the second logical level, (and when the voltage level of the input clock signal CLKIN is the first logical level), the glitch-free circuit 30 may output the inverted first output signal SIG1 to the node ND. When the voltage level of the inverted input clock signal CLKINB is the first logical level (and when the voltage level of the input clock signal CLKIN is the second logical level), the glitch-free circuit 30 may output the inverted second output signal SIG2 to the node ND.

The output circuit 40 may be implemented, for example, as an inverter G0. The inverter G0 may receive input of the voltage level of the node ND and output an output clock signal CLKOUT having the inverted voltage level. The inverter G0 may be a CMOS inverter having two transistors arranged in series between a power supply and a ground supply; however, example embodiments are not limited thereto.

Therefore, when the voltage level of the inverted input clock signal CLKINB inverted by the glitch-free circuit 30 and the output circuit 40 is the second logical level, for example, when the voltage level of the input clock signal CLKIN is the first logical level, the first output signal SIG1 may be output as the output clock signal CLKOUT. When the voltage level of the inverted input clock signal CLKINB is the first logical level, for example, when the voltage level of the input clock signal CLKIN is the second logical level, the second output signal SIG2 may be output as the output clock signal CLKOUT. This will be described below in detail referring to FIG. 5.

Figure 4:
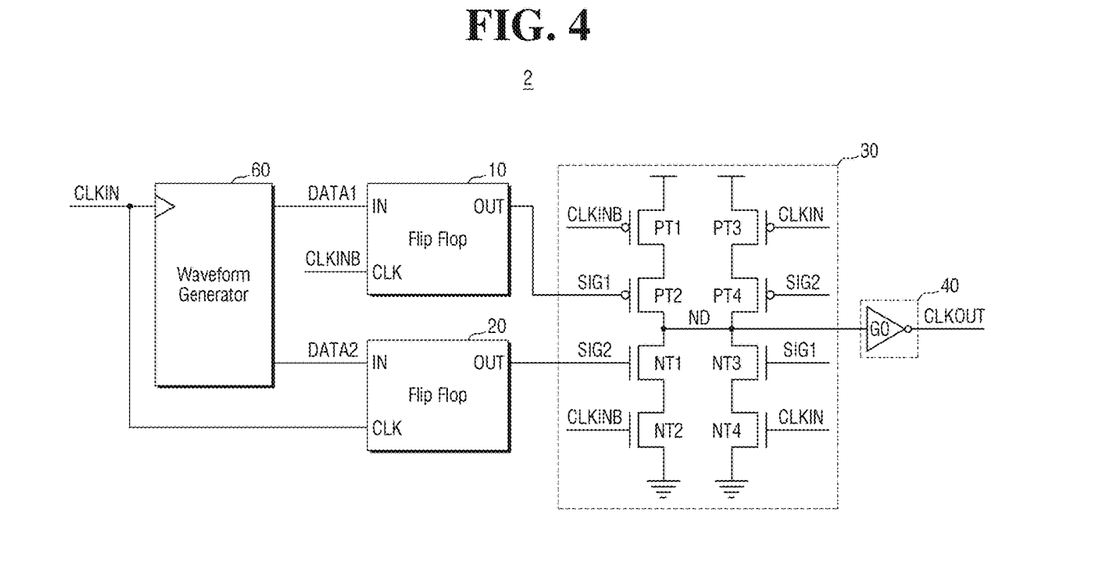
FIG. 4 is a circuit diagram of the semiconductor circuit according to some example embodiments.

FIG. 4 is a circuit diagram of a semiconductor circuit according to some example embodiments. For convenience of explanation, differences from those described referring to FIGS. 1 to 3 will be mainly described.

Referring to FIG. 4, a semiconductor circuit 2 according to some example embodiments may further include a waveform generator 60.

The waveform generator 60 may receive the input of the input clock signal CLKIN to output the first input data DATA1 and the second input data DATA2. The waveform generator 60 may divide the input clock signal CLKIN and output the first input data DATA1 and the second input data DATA2. For example, a cycle of the first input data DATA1 and a cycle of the second input data DATA2 may be about N times (where N is a natural number) a cycle of the input clock signal CLKIN.

Figure 5:
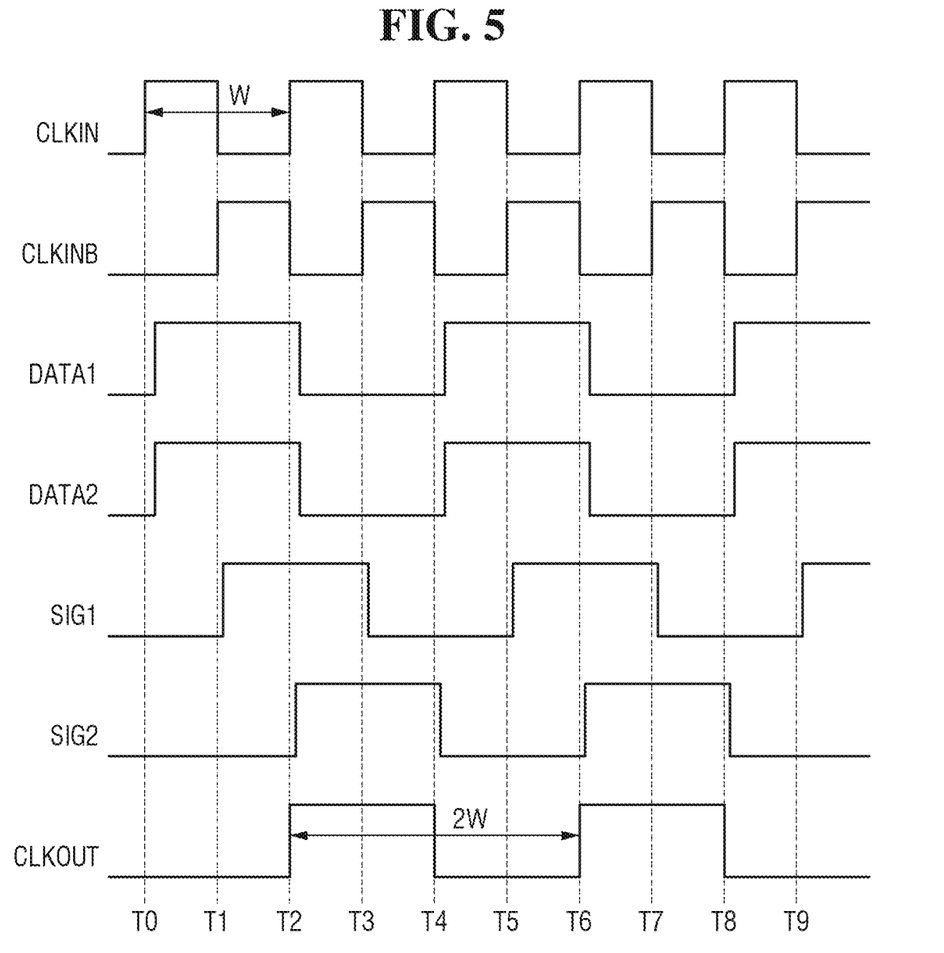
FIG. 5 is a timing diagram for explaining the operation of the semiconductor circuit according to some example embodiments.

FIG. 5 is a timing diagram for explaining the operation of the semiconductor circuit according to some example embodiments.

Referring to FIGS. 1 to 5, the first input data DATA1 and the second input data DATA2 are/correspond to data obtained by dividing the input clock signal CLKIN, and may include a skew, e.g. may have edges that are not aligned to the edges of the clock signal CLKIN. The first input data DATA1 and the second input data DATA2 may be data obtained by dividing the input clock signal CLKIN by two. The cycle of (e.g. wavelength of) the first input data DATA1 and the cycle of the second input data DATA2 may be about twice the cycle W of (e.g. wavelength of) the input clock signal CLKIN.

The first input data DATA1 and the second input data DATA2 may have the same waveform. A duty ratio of the first input data DATA1 and the second input data DATA2 may be about 50%. The first input data DATA1 and the second input data DATA2 may be generated from the waveform generator 60, but example embodiments are not limited thereto.

The first flip-flop 10 is triggered at rising edge time points T1, T3, T5, T7, and T9 of the inverted input clock signal CLKINB, and may be output the first input data DATA1 as the first output signal SIG1. The first flip-flop 10 may delay the first input data DATA1 by about ½ times the cycle of the inverted input clock signal CLKINB to output the first output signal SIG1. Since the first flip-flop 10 outputs the first output signal SIG1 in response to the inverted input clock signal CLKINB, skew of the first output signal SIG1 may be reduced/slightly reduced from skew of the first input data DATA1.

The second flip-flop 20 is triggered at the rising edge time points T0, T2, T4, T6, and T8 of the input clock signal CLKIN, and may output the second input data DATA2 as the second output signal SIG2. The second flip-flop 20 may delay the second input data DATA2 by about 1 times the cycle of the input clock signal CLKIN to output the second output signal SIG2. Since the second flip-flop 20 outputs the second output signal SIG2 in response to the input clock signal CLKIN, skew of the second output signal SIG2 may be reduced/slightly reduced from skew of the second input data DATA2.

At intervals T0-T1, T2-T3, T4-T5, T6-T7, and T8-T9 in which the input clock signal CLKIN is the first logical level and the inverted input clock signal CLKINB is the second logical level, the first transistor PT1 and the eighth transistor NT4 may be turned on, and the third transistor PT3 and the sixth transistor NT2 may be turned off. Accordingly at this time, when the first output signal SIG1 is the second logical level, the second transistor PT2 may be turned on, and the seventh transistor NT3 may be turned off. As a result, the power supply voltage may be provided to the node ND. When the first output signal SIG1 is the first logical level, the second transistor PT2 may be turned off, and the seventh transistor NT3 may be turned off. Accordingly, a ground voltage may be applied to the node ND. At intervals T0-T1, T2-T3, T4-T5, T6-T7, and T8-T9 in which the input clock signal CLKIN is the first logical level and the inverted input clock signal CLKINB is the second logical level, the signal of the node ND may be the inverted first output signal SIG1.

At the intervals T1-T2, T3-T4, T5-T6, and T7-T8 in which the input clock signal CLKIN is at the second logical level and the inverted input clock signal CLKINB is at the first logical level, the first transistor PT1 and the eighth transistor NT4 may be turned off, and the third transistor PT3 and the sixth transistor NT2 may be turned on. At this time, when the second output signal SIG2 is at the second logical level, the fourth transistor PT4 may be turned on, and the fifth transistor NT1 may be turned off. Accordingly, the power supply voltage may be provided to the node ND. When the second output signal SIG2 is the first logical level, the fourth transistor PT4 may be turned off and the fifth transistor NT1 may be turned on. As a result, the ground voltage may be provided to the node ND.

The output circuit 40 may invert the signal of the node ND to output the output clock signal CLKOUT. As a result, the polarity of the output clock signal CLKOUT may match the polarity of the input clock signal CLKIN, the input clock signal CLKIN is divided by two, and an output clock signal CLKOUT having a cycle 2W twice the cycle W of the input clock signal CLKIN may be output.

In summary, at the intervals T0-T1, T2-T3, T4-T5, T6-T7, and T8-T9 in which the input clock signal CLKIN is the first logical level and the inverted input clock signal CLKINB is the second logical level, the first output signal SIG1 may be output as the output clock signal CLKOUT. At the intervals T1-T2, T3-T4, T5-T6, and T7-T8 in which the input clock signal CLKIN is the second logical level and the inverted input clock signal CLKINB is the first logical level, the second output signal SIG2 may be output as the output clock signal CLKOUT. For example, a signal having no skew or a small skew in the first output signal SIG1 and the second output signal SIG2 may be output as the output clock signal CLKOUT at the intervals T0-T1 to T8-T9 having ½ cycle of each input clock signal CLKIN. Therefore, the semiconductor circuit according to some example embodiments may output an output clock signal CLKOUT from which the skew of the rising edge and/or the skew of the falling edge are removed or reduced, and may prevent or reduce the likelihood and/or amount of a glitch.

Additionally or alternatively, the semiconductor circuit according to some example embodiments may include only a transistor gated to the voltage levels of the input clock signal CLKIN, a transistor gated to the voltage levels of the inverted input clock signal CLKINB, a transistor gated to the voltage levels of the first output signal SIG1, and a transistor gated to the voltage levels of the second output signal SIG2, and one inverter G0 that inverts the signal of the node ND, and may not include a transistor gated to the node ND. Therefore, since the semiconductor circuit according to some example embodiments is controlled only by the four signals and/or does not use the logically operated signal, the timing control can be more convenient. Additionally or alternatively, since the semiconductor circuit includes a smaller number of elements, the complexity of the circuit can be reduced.

Figure 6:
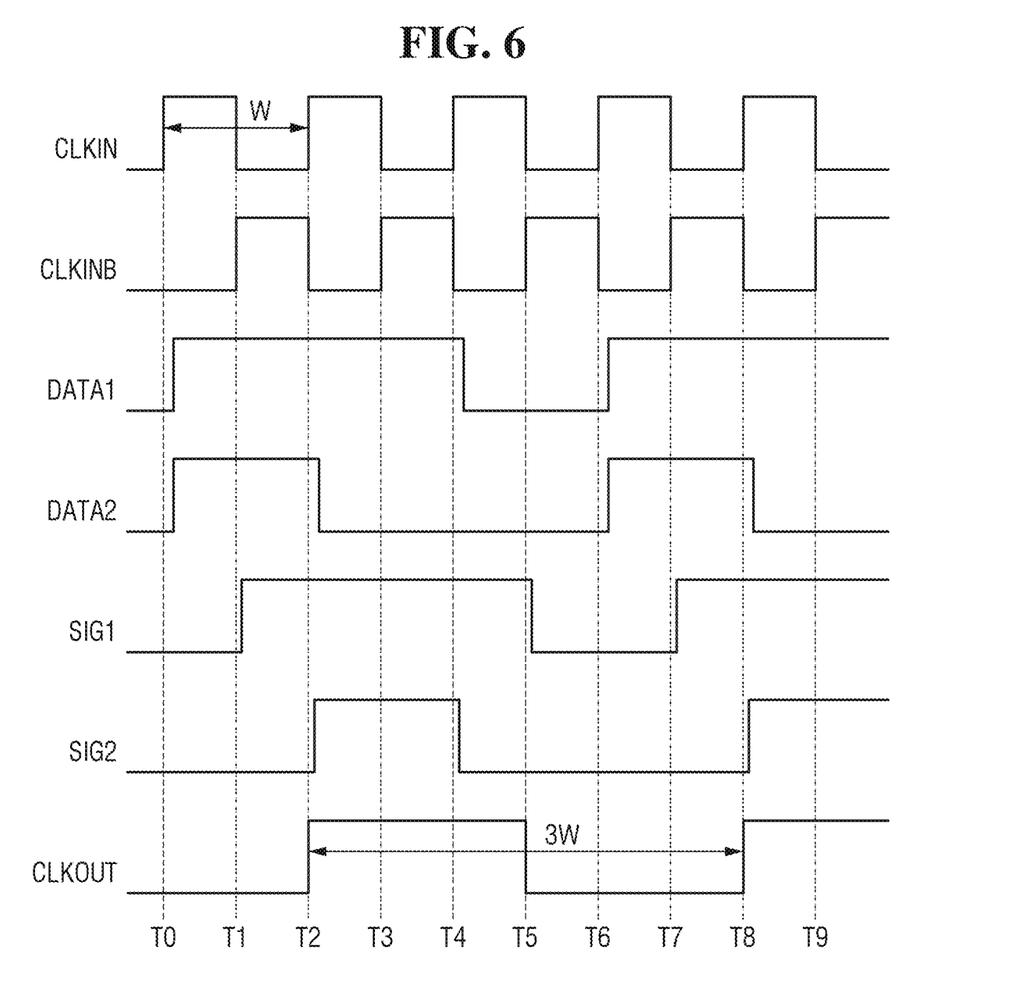
FIG. 6 is a timing diagram for explaining the operation of the semiconductor circuit according to some example embodiments.

FIG. 6 is a timing diagram for explaining the operation of the semiconductor circuit according to some example embodiments. For convenience of explanation, differences from those described referring to FIGS. 1 to 5 will be mainly described.

Referring to FIGS. 1 to 4 and 6, the first input data DATA1 and the second input data DATA2 may be data obtained by dividing the input clock signal CLKIN by two. The cycle of the first input data DATA1 and the cycle of the second input data DATA2 may be or be about three times the cycle W of the input clock signal CLKIN.

The first input data DATA1 and the second input data DATA2 may have different waveforms from each other. The duty ratio of the first input data DATA1 and the duty ratio of the second input data DATA2 may be different from each other. The first input data DATA1 and the second input data DATA2 may be generated from, but are not limited to, the waveform generator 60.

In the semiconductor circuit according to some example embodiments, a signal having no skew in the first output signal SIG1 and the second output signal SIG2 may be output as the output clock signal CLKOUT at the intervals T0-T1 to T8-T9 having a half cycle of each input clock signal CLKIN. Therefore, the semiconductor circuit according to some example embodiments may output the output clock signal CLKOUT which has a cycle 3W that is three times the cycle W of the input clock signal CLKIN, and in which the skew of the rising edge and/or the skew of the falling edge are removed or reduced.

Figure 7:
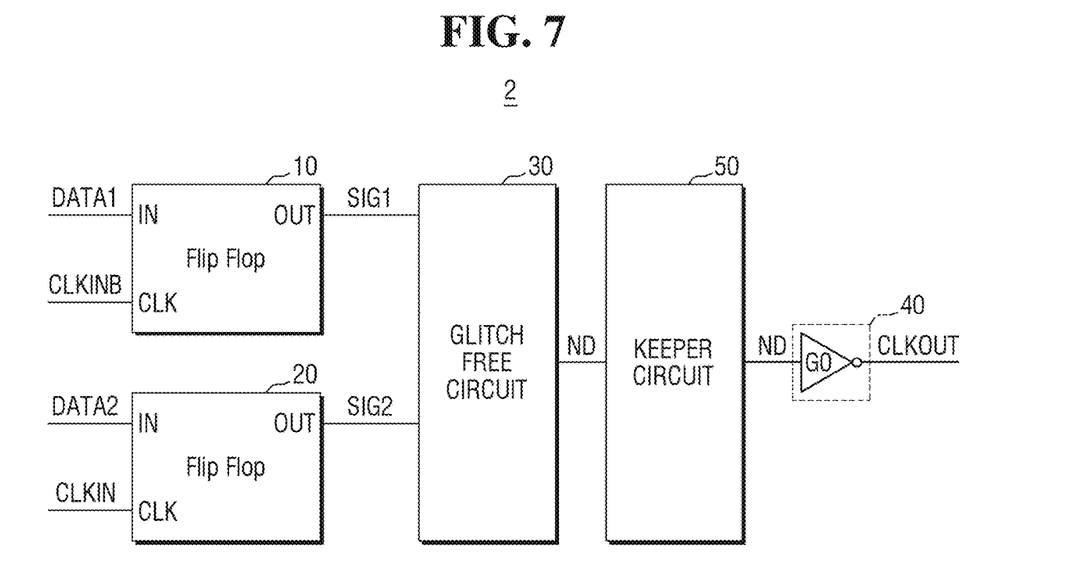
FIG. 7 is a block diagram for explaining the semiconductor circuit according to some example embodiments.
Figure 8:
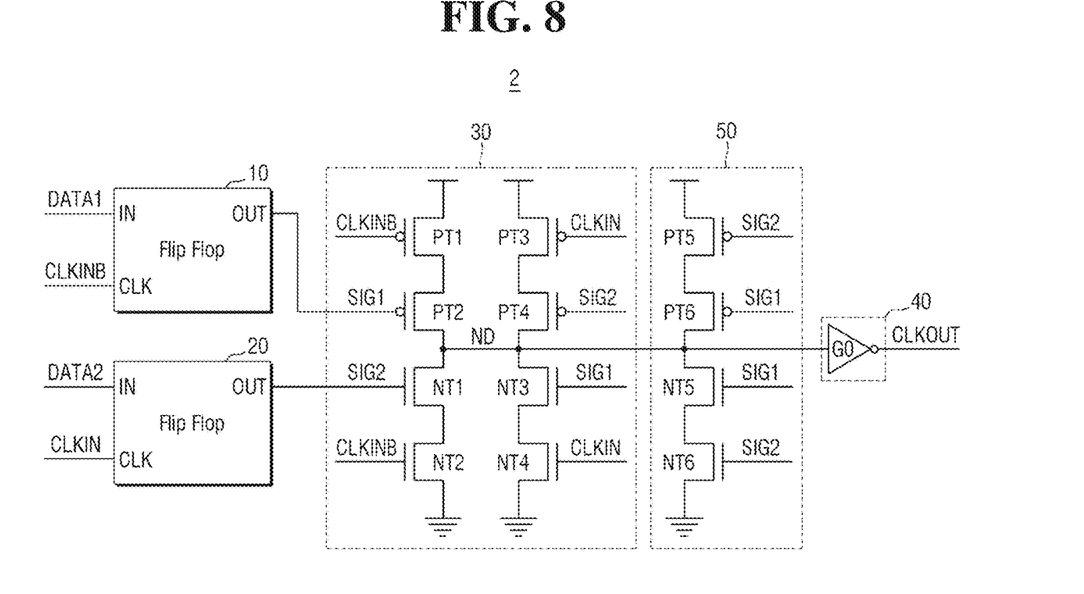
FIG. 8 is a circuit diagram of FIG. 7.

FIG. 7 is a block diagram for explaining a semiconductor circuit according to some example embodiments. FIG. 8 is a circuit diagram of FIG. 7. For convenience of explanation, differences from those described referring to FIGS. 1 to 6 will be mainly described.

Referring to FIGS. 7 and 8, the semiconductor circuit according to some example embodiments may further include a keeper circuit 50 placed between the glitch-free circuit 30 and the output circuit 40.

The keeper circuit 50 may act as a buffer when the voltage level of the inverted input clock signal CLKINB is transitioned to another logical level. For example, when a first time point at which the voltage level of the input clock signal CLKIN is transitioned from the first logical level to the second logical level is different from a second time point at which the voltage level of the inverted input clock signal CLKINB is transitioned from the second logical level to the first logical level according to the transition of the input clock signal CLKIN, the keeper circuit 50 may correct the signal of the node ND between the first time point and the second time point.

In the semiconductor circuit according to some example embodiments, the keeper circuit 50 may include ninth to twelfth transistors PT5, PT6, NT5, and NT6. Transistors PT5 and PT6 may be P-type, e.g. PMOS, transistors having the same or different physical and/or electrical characteristics such as threshold voltages and/or gate lengths and/or gate widths, and transistors NT5 and NT6 may be N-type, e.g. NMOS, transistors having the same or different physical and/or electrical characteristics such as threshold voltages and/or gate lengths and/or gate widths; however, example embodiments are not limited thereto.

A ninth transistor PT5 may be gated to the voltage level of the second output signal SIG2 to provide the power supply voltage to a tenth transistor PT6. The tenth transistor PT6 may be connected in series with the ninth transistor PT5 and gated to the voltage level of the first output signal SIG1 to provide the power supply voltage to the node ND. The ninth and tenth transistors PT5 and PT6 may be connected in parallel with the third and fourth transistors PT3 and PT4.

A twelfth transistor NT6 may be gated to the voltage level of the second output signal SIG2 to provide the ground voltage to an eleventh transistor NT5. The eleventh transistor NT5 may be connected in series with the twelfth transistor NT6 and gated to the voltage level of the first output signal SIG1 to provide the ground voltage to the node ND. The eleventh and twelfth transistors NT5 and NT6 may be connected in parallel with the seventh and eighth transistors NT3 and NT4.

In some example embodiments, the ninth and tenth transistors PT5 and PT6 and the eleventh and twelfth transistors NT5 and NT6 may be different types of transistors from each other. For example, the ninth and tenth transistors PT5 and PT6 may be P-type transistors, and the eleventh and twelfth transistors NT5 and NT6 may be N type transistors. None of the gates of transistors PT1-PT6 or NT1-NT6 may be connected to the node ND.

Figure 9:
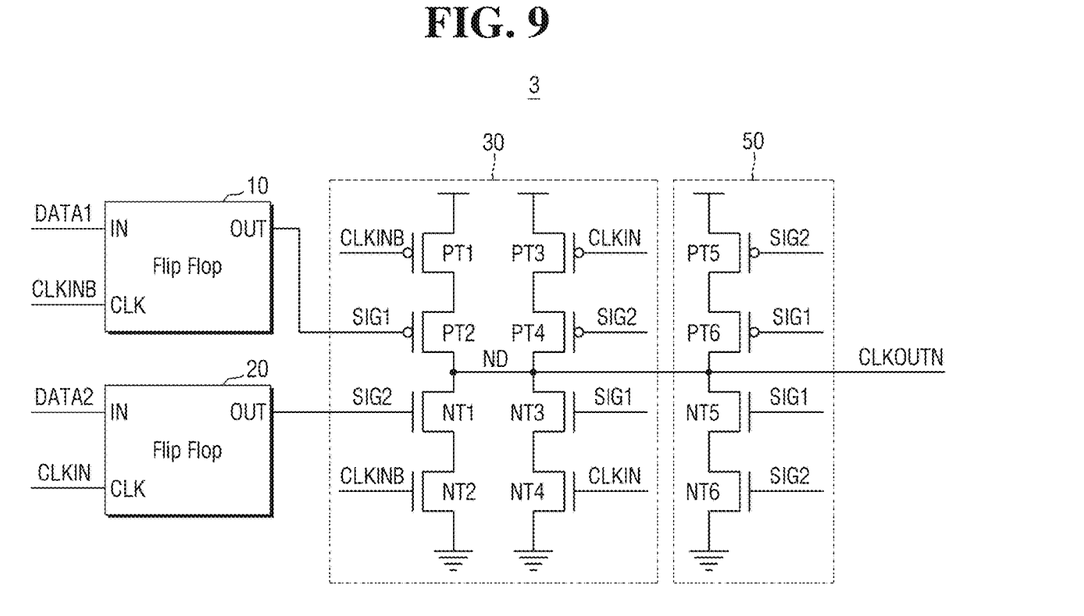
FIG. 9 is a circuit diagram of the semiconductor circuit according to some example embodiments.

FIG. 9 is a circuit diagram of a semiconductor circuit according to some example embodiments. For convenience of explanation, differences from those described referring to FIGS. 1 to 8 will be mainly described.

Referring to FIG. 9, a semiconductor circuit 3 according to some example embodiments may not include an output circuit. As a result, the semiconductor circuit 3 may output an inverted output clock signal CLKOUTN that is different from the polarity of the input clock signal CLKIN.

Figure 10:
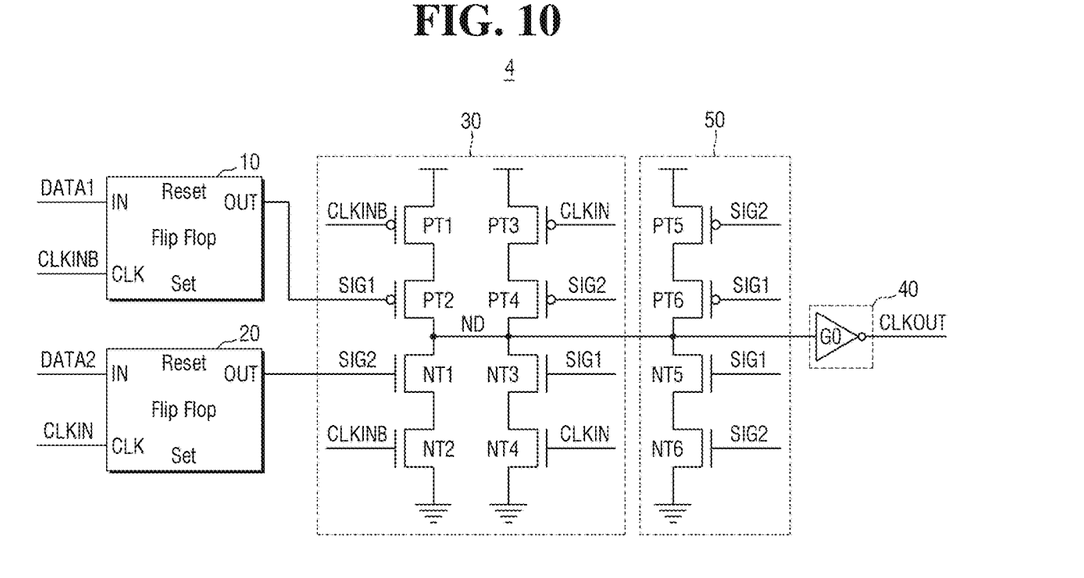
FIG. 10 is a circuit diagram of the semiconductor circuit according to some example embodiments.
Figure 11:
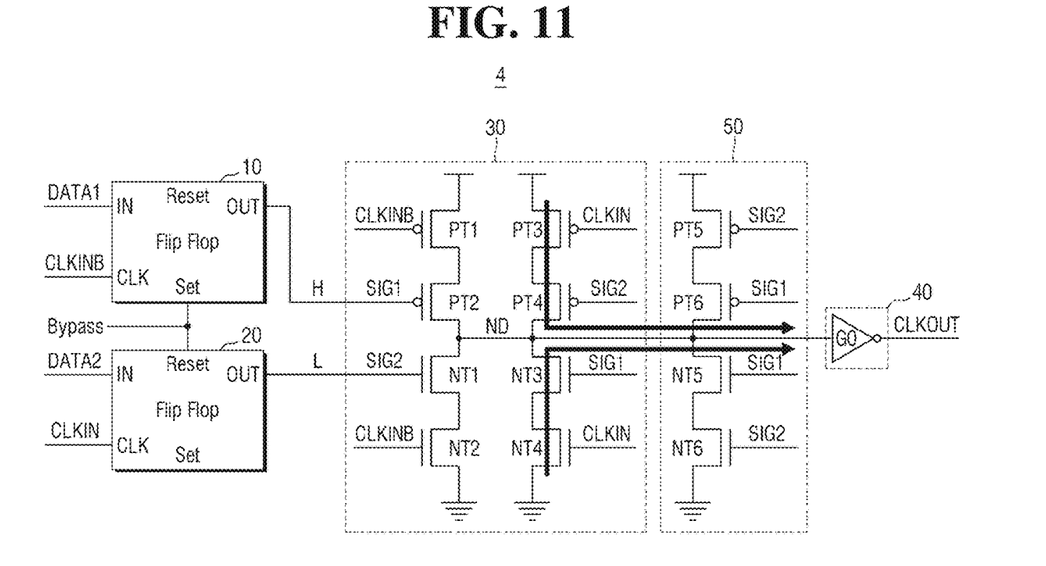
FIG. 11 is a diagram for explaining the operation of the semiconductor circuit of FIG. 10.

FIG. 10 is a circuit diagram of a semiconductor circuit according to some example embodiments. FIG. 11 is a diagram for explaining the operation of the semiconductor circuit of FIG. 10. For convenience of explanation, differences from those described referring to FIGS. 1 to 8 will be mainly described.

Referring to FIG. 10, in a semiconductor circuit 4 according to some example embodiments, the first flip-flop 10 and the second flip-flop 20 may include a reset terminal and a set terminal; e.g. the first flip flop 10 and the second flip-flop 20 may be S-R flip flops.

Referring to FIG. 11, the first flip-flop 10 may receive input of the set signal, and the second flip-flop 20 may receive input of the reset signal.

The first flip-flop 10 may output a first output signal SIG1 in which the voltage level is the first logical level H in response to the set signal. The second flip-flop 20 may output a second output signal SIG2 in which the voltage level is the second logical level L in response to the reset signal. Accordingly, the second, fifth, tenth and twelfth transistors PT2, NT1, PT6, and NT6 may be turned off, and the fourth, seventh, ninth and eleventh transistors PT4, NT3, PT5, and NT5 may be turned on. Therefore, the turning-on/off of the third and eighth transistors PT3 and NT4 is controlled depending on the voltage level of the input clock signal CLKIN, and the voltage level of the node ND may be determined. When the input clock signal CLKIN is the first logical level, the eighth transistor NT4 may be turned on to provide the ground voltage to the node ND. When the input clock signal CLKIN is the second logical level, the third transistor PT3 may be turned on to provide the power supply voltage to the node ND. Therefore, the semiconductor circuit 4 may bypass the input clock signal CLKIN and output it as the output clock signal CLKOUT.

Example embodiments are not limited to those described above. Furthermore example embodiments described with reference to the above figures are not necessarily mutually exclusive. For example, some example embodiments may include features associated with and described with respect to one figure, and may also include features associated with and described with respect to another figure.

Figure 12:
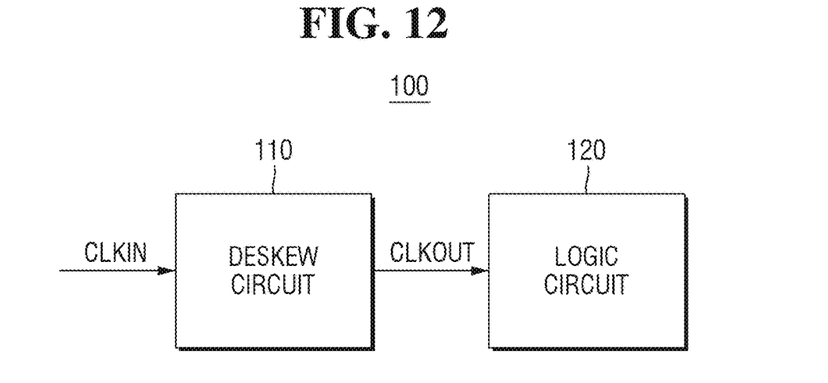
FIG. 12 is a block diagram showing a semiconductor integrated circuit device including the semiconductor circuit according to some example embodiments.

FIG. 12 is a block diagram showing a semiconductor integrated circuit device including the semiconductor circuit according to some example embodiments.

Referring to FIG. 12, a semiconductor circuit 100 according to some example embodiments may include a semiconductor circuit 110 and a logic circuit 120.

The semiconductor circuit 110 may receive input of the input clock signal CLKIN to output the output clock signal CLKOUT. The semiconductor circuit 110 may be one of the semiconductor circuits according to some example embodiments described above.

The logic circuit 120 may receive input of the output clock signal CLKOUT that is output from the semiconductor circuit 110. The logic circuit 120 may operate on the basis of the output clock signal CLKOUT.

The logic circuit 120 may include a plurality of logic circuits such as logic gates and/or multiplexing circuits and/or inverters and/or decoder circuits. Each of the plurality of logic circuits receives the input of the output clock signal CLKOUT from the semiconductor circuit 110, and may operate on the basis of the output clock signal CLKOUT. Each output clock signal CLKOUT may be different clock signals from each other.

Figure 13:
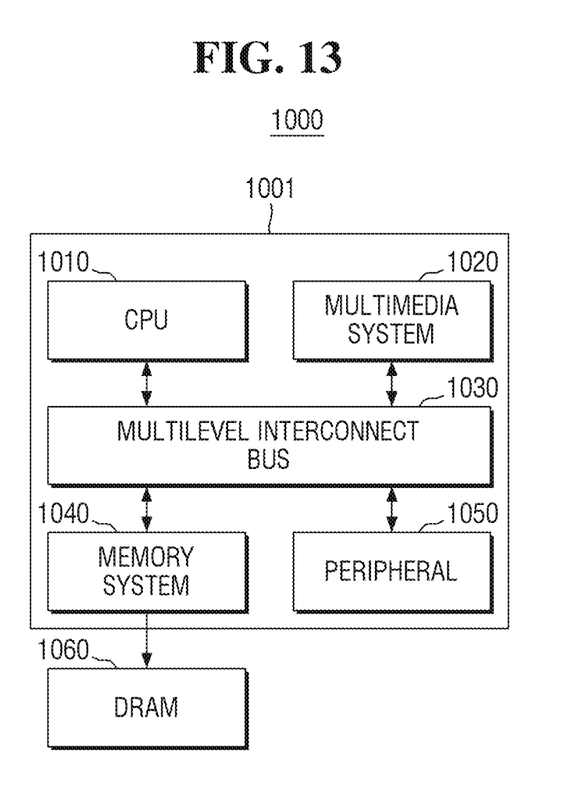
FIG. 13 is a block diagram of a SoC system including the semiconductor circuit according to some example embodiments.

FIG. 13 is a block diagram of a SoC system including a semiconductor circuit according to some example embodiments.

Referring to FIG. 13, a SoC system 1000 including the semiconductor circuit according to some example embodiments may include an application processor 1001 and a DRAM 1060.

The application processor 1001 may include a central processing unit 1010, a multimedia system 1020, a bus 1030, a memory system 1040, and a peripheral circuit 1050.

The central processing unit 1010 may perform the operations required to drive the SoC system 1000. In some example embodiments of inventive concepts, the central processing unit 1010 may be configured in a multi-core environment including a plurality of cores.

The multimedia system 1020 may be used to perform various multimedia functions in the SoC system 1000. The multimedia system 1020 may include at least one of a 3D engine module, a video codec, a display system, a camera system, a post-processor, and the like.

The bus 1030 may be used by the central processing unit 1010, the multimedia system 1020, the memory system 1040, and the peripheral circuit 1050 to perform data communication with each other. In some example embodiments of inventive concepts, such a bus 1030 may have a multi-layer structure. For example, as an example of such a bus 1030, a multi-layer AHB (multi-layer Advanced High-performance Bus) and/or a multi-layer AXI (multi-layer Advanced eXtensible Interface) may be used. However, inventive concepts are not limited thereto.

The memory system 1040 may provide an environment required for connecting the application processor 1001 to an external memory (e.g., DRAM 1060) to perform a high-speed operation. In some example embodiments of the disclosure, the memory system 1040 may also include another controller (e.g., a DRAM controller) for controlling an external memory (e.g., DRAM 1060).

The peripheral circuit 1050 may provide an environment required for smoothly connecting the SoC system 1000 to an external device (e.g., a motherboard). As a result, the peripheral circuit 1050 may be provided with various interfaces that make the external device connected to the SoC system 1000 compatible.

The DRAM 1060 may function as an operation memory required for the application processor 1001 to operate. In some example embodiments of the disclosure, the DRAM 1060 may be placed outside the application processor 1001 as shown. For example, DRAM 1060 may be packaged with the application processor 1001 in the form of a PoP (Package on Package).

At least one of the components of the SoC system 1000 may adopt any one of the semiconductor circuits according to some example embodiments described above.

Any of or all of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In concluding the detailed description, those of ordinary skill in the art will appreciate that many variations and modifications may be made to example embodiments without substantially departing from the principles of inventive concepts. Therefore, example embodiments of inventive concepts are used in a generic and descriptive sense only and not for purposes of limitation.

What is claimed is:

1. A semiconductor circuit comprising:
   a first flip-flop configured to output a first input data as a first output signal in response to an inverted input clock signal;
   a second flip-flop configured to output a second input data as a second output signal in response to an input clock signal;
   a glitch-free circuit configured to receive the inverted input clock signal, the input clock signal, the first output signal, and the second output signal, and to determine a voltage level of a node on the basis of the inverted input clock signal, the input clock signal, the first output signal, and the second output signal; and
   an inverter configured to output an output clock signal obtained by inverting the voltage level of the node determined by the glitch-free circuit, wherein
   the glitch-free circuit does not include a transistor having a gate connected to the node.

2. The semiconductor circuit of claim 1, wherein in a case where the voltage level of the input clock signal is a second logical level, and the voltage level of the second output signal is the second logical level, the voltage level of the node is a first logical level,
   in the case where the voltage level of the input clock signal is the second logical level, and the voltage level of the second output signal is the first logical level, the voltage level of the node is the second logical level,
   in a case where the voltage level of the inverted input clock signal is the second logical level, and the voltage level of the first output signal is the second logical level, the voltage level of the node is the first logical level, and
   in the case where the voltage level of the inverted input clock signal is the second logical level, and the voltage level of the first output signal is the first logical level, the voltage level of the node is the second logical level.

3. The semiconductor circuit of claim 2, wherein the glitch-free circuit includes:
   a first transistor and a second transistor configured to provide a power supply voltage to the node and connected in series with each other,
   a third transistor and a fourth transistor that connected in parallel with the first transistor and the second transistor and configured to provide the power supply voltage to the node, and are connected in series with each other,
   a fifth transistor and a sixth transistor configured to provide a ground voltage to the node and connected in series with each other, and
   a seventh transistor and an eighth transistor connected in parallel with the fifth transistor and the sixth transistor, and connected in series with each other,
   the first transistor and the sixth transistor are gated to the voltage level of the inverted input clock signal,
   the second transistor and the seventh transistor are gated to the voltage level of the first input data,
   the third transistor and the eighth transistor are gated to the voltage level of the input clock signal, and
   the fourth transistor and the fifth transistor are gated to the voltage level of the second input data.

4. The semiconductor circuit of claim 3, further comprising:
   a ninth transistor and a tenth transistor connected in parallel with the third transistor and the fourth transistor and configured to provide the power supply voltage to the node, and connected in series with each other, and
   an eleventh transistor and a twelfth transistor connected in parallel with the seventh transistor and the eighth transistor and configured to provide the ground voltage to the node, and are connected in series with each other,
   wherein the tenth transistor and the eleventh transistor are gated to the voltage level of the first input data, and
   the ninth transistor and the twelfth transistor are gated to the voltage level of the second input data.

5. The semiconductor circuit of claim 1, wherein in response to a set signal the first flip-flop is configured to output the first output signal in which a voltage level is a first logical level,
   in response to a reset signal the second flip-flop is configured to output the second output signal in which a voltage level is a second logical level, and
   the glitch-free circuit is configured to bypass the input clock signal and to output the input clock signal as the output clock signal.

6. The semiconductor circuit of claim 1, further comprising:
   a waveform generator circuitry configured to output the first input data and the second input data on the basis of the input clock signal.

7. The semiconductor circuit of claim 6, wherein the waveform generator circuitry is configured to divide the input clock signal to output the first input data and the second input data,
   a frequency of the first input data and a frequency of the second input data are N times (N is a natural number) a frequency of the input clock signal, and
   a duty ratio of the first input data is the same as a duty ratio of the second input data.

8. The semiconductor circuit of claim 7, wherein the duty ratio of the first input data and the duty ratio of the second input data are 50%.

9. The semiconductor circuit of claim 6, wherein the waveform generator circuitry is configured to divide the input clock signal to output the first input data and the second input data,
   a frequency of the first input data and a frequency of the second input data are N times (N is a natural number) a frequency of the input clock signal, and a duty ratio of the first input data is different from a duty ratio of the second input data.

10. The semiconductor circuit of claim 1, wherein the first flip-flop is configured to output the first input data as the first output signal in response to a rising edge of the inverted input clock signal, and
the second flip-flop is configured to output the second input data as the second output signal in response to a rising edge of the input clock signal.

11. A semiconductor circuit comprising:
a first flip-flop configured to output first input data as a first output signal in response to an inverted input clock signal;
a second flip-flop configured to output second input data as a second output signal in response to an input clock signal;
a first transistor and a second transistor configured to provide a power supply voltage to a node and are connected in series with each other;
a third transistor and a fourth transistor connected in parallel with the first transistor and the second transistor and configured to provide the power supply voltage to the node, and connected in series with each other;
a fifth transistor and a sixth transistor configured to provide a ground voltage to the node, and connected in series with each other;
a seventh transistor and an eighth transistor connected in parallel with the fifth transistor and the sixth transistor and configured to provide the ground voltage to the node, and are connected in series with each other; and
an inverter connected to the node and configured to output an output clock signal obtained by inverting a voltage level of the node,
wherein the first transistor and the sixth transistor are gated to a voltage level of the inverted input clock signal,
a second transistor and the seventh transistor are gated to a voltage level of the first input data,
the third transistor and the eighth transistor are gated to a voltage level of the input clock signal, and
the fourth transistor and the fifth transistor are gated to a voltage level of the second input data.

12. The semiconductor circuit of claim 11, wherein the first flip-flop is configured to set a voltage level of the first output signal to a first logical level in response to a set signal input to a set terminal,
the second flip-flop is configured to reset a voltage level of the second output signal to a second logical level in response to a reset signal input to a reset terminal, and
a voltage level of the output clock signal is a voltage level of the input clock signal.

13. The semiconductor circuit of claim 12, wherein in response to the voltage level of the input clock signal being the first logical level, the third transistor and the fourth transistor are configured to provide the power supply voltage to the node,
in response to the voltage level of the input clock signal being the second logical level, the seventh transistor and the eighth transistor are configured to provide the ground voltage to the node, and
the voltage level of the output clock signal is the voltage level of the input clock signal.

14. The semiconductor circuit of claim 11, further comprising:
a ninth transistor and a tenth transistor connected in parallel with the third transistor and the fourth transistor and configured to provide the power supply voltage to the node, and are connected in series with each other; and
an eleventh transistor and a twelfth transistor configured to provide the ground voltage to the node, and connected in series with each other,
wherein the tenth transistor and the eleventh transistor are gated to the voltage level of the first output data, and
the ninth transistor and the twelfth transistor are gated to the voltage level of the second output data.

15. The semiconductor circuit of claim 11, further comprising:
a waveform generator circuitry configured to divide the input clock signal to output the first input data and the second input data,
wherein a frequency of the first input data and a frequency of the second input data are N times (N is a natural number) a frequency of the input clock signal.

16. The semiconductor circuit of claim 15, wherein a duty ratio of the first input data is different from a duty ratio of the second input data.

17. The semiconductor circuit of claim 15, wherein a duty ratio of the first input data is the same as a duty ratio of the second input data.

18. A semiconductor circuit comprising:
a first flip-flop configured to output first input data as a first output signal in response to an inverted input clock signal;
a second flip-flop configured to output second input data as a second output signal in response to an input clock signal;
a glitch-free circuit configured to determine a voltage level of a node on the basis of a voltage level of the second output signal in response to a voltage level of the inverted input clock signal being a first logical level, and to determine the voltage level of the node on the basis of a voltage level of the first output signal in response to the voltage level of the inverted input clock signal being a second logical level; and
an inverter configured to output an output clock signal obtained by inverting a determined voltage level of the node.

19. The semiconductor circuit of claim 18, wherein
in a case where the voltage level of the inverted input clock signal is the first logical level and the voltage level of the second output signal is the second logical level, the glitch-free circuit is configured to determine the voltage level of the node as the first logical level,
in a case where the voltage level of the inverted input clock signal is the first logical level and the voltage level of the second output signal is the first logical level, the glitch-free circuit is configured to determine the voltage level of the node as the second logical level, and
in the case where the voltage level of the inverted input clock signal is the second logical level and the voltage level of the first output signal is the first logical level, the glitch-free circuit is configured to determine the voltage level of the node as the first logical level, and
in a case where the voltage level of the inverted input clock signal is the second logical level and the voltage level of the first output signal is the first logical level, the glitch-free circuit is configured to determine the voltage level of the node as the second logical level.

20. The semiconductor circuit of claim 18, wherein a frequency of the first input data and a frequency of the second input data are N times (N is a natural number) a frequency of the input clock signal.

* * * * *

UNITED STATES PATENT AND TRADEMARK OFFICE
CERTIFICATE OF CORRECTION

| | | |
|---|---|---|
| PATENT NO. | : 11,526,194 B2 | |
| APPLICATION NO. | : 17/385182 | |
| DATED | : December 13, 2022 | |
| INVENTOR(S) | : Hyun Chul Hwang et al. | |

It is certified that error appears in the above-identified patent and that said Letters Patent is hereby corrected as shown below:

On the Title Page (72), Line 1, The 1st inventor's name reads as "Hyun Chui HWANG", but should read --Hyun Chul HWANG--.

Signed and Sealed this
Eleventh Day of July, 2023

Katherine Kelly Vidal
*Director of the United States Patent and Trademark Office*